United States Patent
Signell et al.

(10) Patent No.: US 6,546,061 B2
(45) Date of Patent: Apr. 8, 2003

(54) SIGNAL TRANSFORMATION METHOD AND APPARATUS

(75) Inventors: Svante Signell, Vällingby (SE); Thorsten Schier, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 157 days.

(21) Appl. No.: 09/775,820

(22) Filed: Feb. 5, 2001

(65) Prior Publication Data

US 2001/0050966 A1 Dec. 13, 2001

Related U.S. Application Data

(62) Division of application No. 08/941,348, filed on Sep. 30, 1997, now Pat. No. 6,215,828.

(30) Foreign Application Priority Data

Oct. 2, 1996 (SE) ................................................ 9603602

(51) Int. Cl.$^7$ ..................... H03K 9/00; H04L 27/06; H04L 27/14; H04L 27/22
(52) U.S. Cl. ....................................... 375/316; 375/350
(58) Field of Search ................................. 375/316, 298, 375/261, 279, 295, 320, 329, 350, 229; 329/304, 305, 306, 310; 332/103, 104, 105

(56) References Cited

U.S. PATENT DOCUMENTS

| | | | |
|---|---|---|---|
| 3,804,988 A | 4/1974 | Browne | |
| 4,891,840 A | 1/1990 | Reudink | |
| 5,388,062 A | 2/1995 | Knutson | |
| 5,473,280 A | * 12/1995 | Ohnishi et al. | ............. 329/304 |
| 5,579,341 A | 11/1996 | Smith et al. | |

OTHER PUBLICATIONS

Proakis, John G. et al., "Digital Signal Processing:Principles, Algorithms, and Applications", Chapter 6.2.1 and 7.2.4, (1992).

Signell, S. et al., "Design and Analysis of Bilinear Digital Ladder Filters", IEEE Transactions of Circuits and Systems, pp. 1–13, (Feb. 1996).

* cited by examiner

*Primary Examiner*—Phuong Phu

(57) ABSTRACT

A base station in a radio telecommunication system, transforms real digital wideband high-frequency signals into a set of complex digital baseband signals and vice versa. The base station receives a set of complex digital baseband signals having an "I" and a "Q" components. A portion of these signals are modulated and then converted into complex digital high-frequency signals. The complex digital high-frequency signals are then filtered via bilinear digital ladder bandpass filters to retrieve real digital narrowband high-frequency signals. The outputs of these filters are the same corresponding "I" and "Q" components at the narrowband frequencies. These signals are further combined to form real digital wideband high-frequency signals. Finally, the combined signals are converted through a D/A converter to real analog wideband high-frequency bandpass signals.

9 Claims, 14 Drawing Sheets

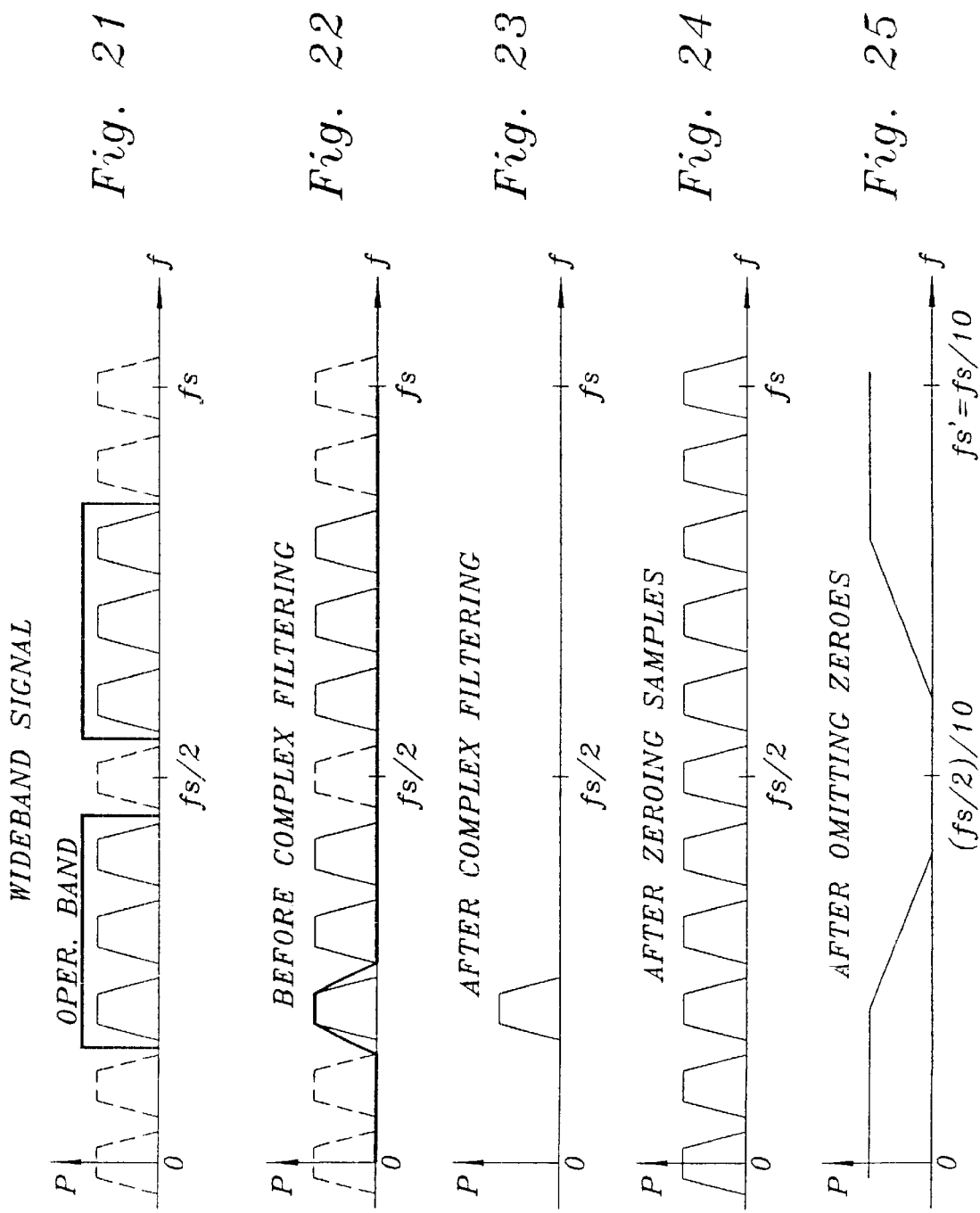

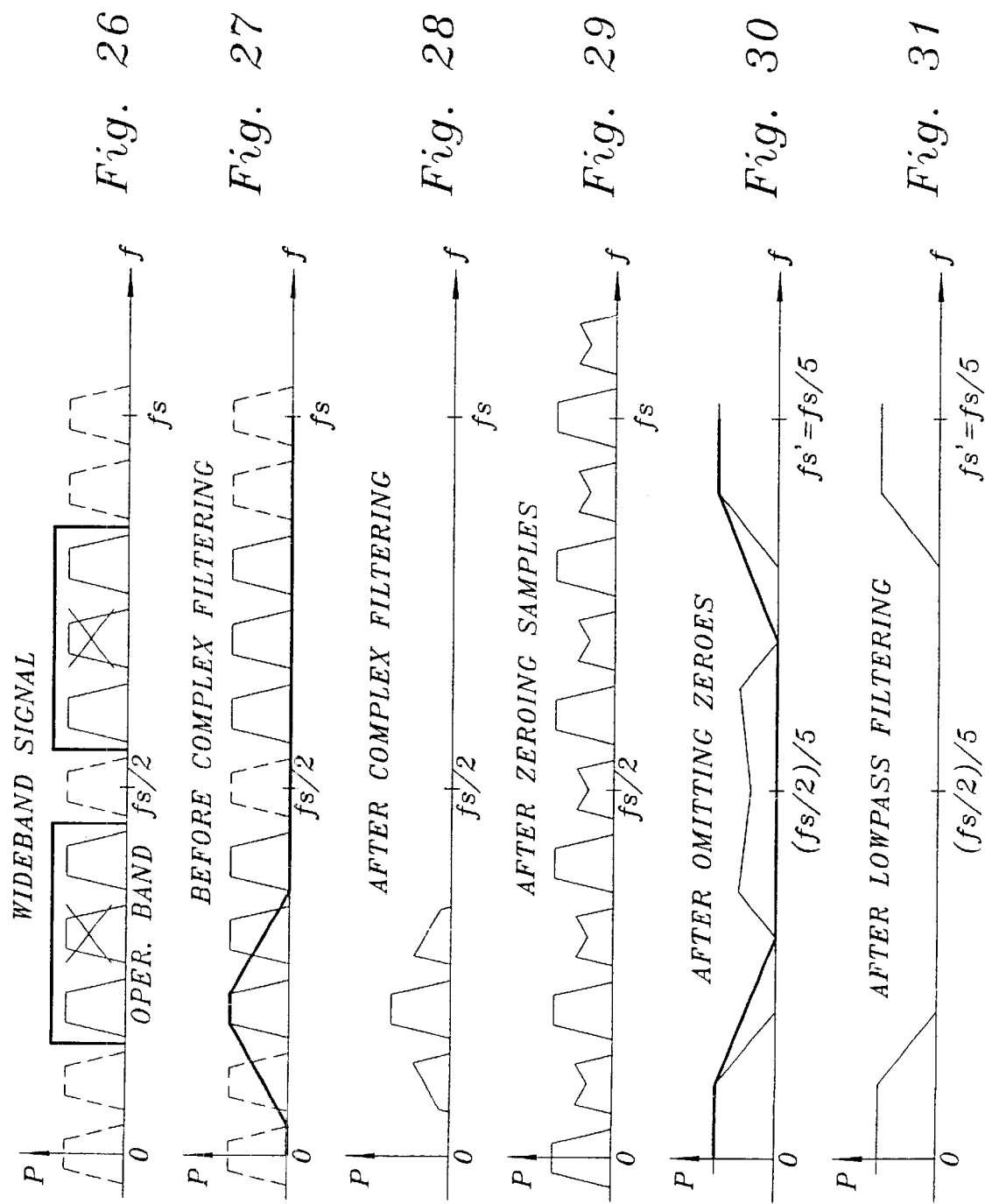

SIGNAL TRANSFORMATION METHOD AND APPARATUS

This application is a divisional, of application Ser. No. 08/941,348, filed Sep. 30, 1997 now U.S. Pat. No. 6,215,828.

TECHNICAL FIELD

The present invention relates to a method and apparatus for transforming a real digital wideband high-frequency signal into a set of complex digital baseband signals, a method and apparatus for transforming a set of complex digital baseband signals into a real digital wideband high-frequency signal, a preferred type of complex filter that may be used in these transformations and a base station in a radio communication system that uses these transformations.

BACKGROUND

A base station in a mobile telephony system receives and transmits wideband high-frequency radio signals having a bandwidth of up to 30 MHz. The received wideband signal is separated into narrowband (for example 30 kHz wide) channels (FDMA) or channel groups (TDMA). In the reverse process channels or channel groups are combined into a wideband signal for transmission.

It has been suggested to perform A/D conversion of the entire wideband spectrum and to perform the channel separation digitally. For each channel or channel group the digital wideband signal is demodulated with a different frequency in order to shift this particular channel or channel group down to the baseband. The demodulation is performed with a quadrature network for generating the I and Q components. Thereafter these components are low-pass filtered in order to separate the desired channel or channel group from the unwanted neighbor channels or channel groups. Finally the samples of the separated signals are decimated (down-sampled).

In the reverse process baseband signals are interpolated (up-sampled), modulated and combined into a wideband signal.

A drawback of these methods is that the demodulation and modulation has to be performed at the high sampling frequency of the digital wideband signal, which requires a lot of data processing. Furthermore, the required local oscillators and multipliers require a lot of space and are power consuming.

SUMMARY

An object of the present invention is to reduce the amount of required data processing in the transformation from wideband signal to baseband signals and from baseband signals to wideband signals.

This object is solved by the method, apparatus and base station in accordance with the accompanying claims.

A further object of the present invention is a preferred type of complex filter that is used in this transformation.

Briefly, the present invention performs the channel separation at the high wideband signal sampling frequency by using complex bandpass filters. Instead of demodulating the wideband signal down to baseband, a frequency reduction may be performed on the I and Q signals that are obtained directly from the complex filters simply by decimating (down-sampling) the number of samples.

In a modification of the present invention, used when the baseband may not reached directly by decimation, most of the advantage may still be obtained by performing a demodulation to baseband after decimation to a frequency near baseband.

Similarly, a complex filter may be used to filter an interpolated (up-sampled) baseband or low frequency signal for obtaining a narrowband high-frequency signal. Such high-frequency signals may then be combined into a wideband signal for transmission.

In a modification of the present invention, used when the high frequency band may not reached directly by interpolation, most of the advantage may still be obtained by performing a modulation to a frequency near baseband before the interpolation.

BRIEF DESCRIPTION OF THE DRAWINGS

The invention, together with further objects and advantages thereof, may best be understood by making reference to the following description taken together with the accompanying drawings, in which:

FIG. 21 is a power spectrum diagram illustrating a wideband signal;

FIG. 22 is a power spectrum diagram illustrating a complex filter intended to operate on a wideband signal having the power spectrum of FIG. 21;

FIG. 23 is a power spectrum diagram illustrating the effect of the complex filter on a wideband signal having the power spectrum of FIG. 21;

FIG. 24 is a power spectrum diagram illustrating the effect of setting some of the samples in a passband signal having the power spectrum of FIG. 23 to zero;

FIG. 25 is a power spectrum diagram illustrating the effect of omitting the zero samples in a signal having the power spectrum of FIG. 24;

FIG. 26 is a power spectrum diagram illustrating a wideband signal;

FIG. 27 is a power spectrum diagram illustrating a complex filter intended to operate on a wideband signal having the power spectrum of FIG. 26;

FIG. 28 is a power spectrum diagram illustrating the effect of the complex filter on a wideband signal having the power spectrum of FIG. 26;

FIG. 29 is a power spectrum diagram illustrating the effect of setting some of the samples in a passband signal having the power spectrum of FIG. 28 to zero;

FIG. 30 is a power spectrum diagram illustrating the effect of omitting the zero samples in a signal having the power spectrum of FIG. 29;

FIG. 31 is a power spectrum diagram illustrating the effect of lowpass filtering a signal having the power spectrum of FIG. 30;

DETAILED DESCRIPTION

Throughout the figures of the drawings the same reference designations will be used for the same or similar elements.

Since the concept of a complex filter is essential for the present invention, this description will start by introducing complex filters with reference to FIGS. 1–6.

Figure 1:
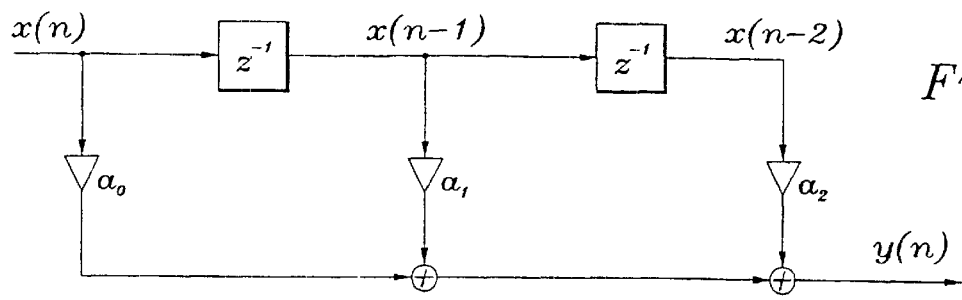
FIG. 1 is a block diagram of a simple FIR filter.

FIG. 1 illustrates a simple FIR filter having two delay elements denoted $z^{-1}$ and filter coefficients $a_0$, $a_1$, and $a_2$.

An essential component of the present invention is a complex bandpass filter. In accordance with a preferred embodiment of the present invention such a complex bandpass filter is designed by designing a low-pass filter prototype having all the desired properties, i.e. passband ripple, transmission band and cut off frequency, and by frequency translating this low-pass filter into a complex bandpass filter. This frequency translation is done by substituting $z_0 \cdot z$ for $z$ in the low-pass filter prototype transfer function. Here $z_0$ is a point on the unit circle defined by $$z_0 = e^{j\Omega_0 T}$$

where $\Omega_0$ is the center (angular) frequency of the passband of the translated complex filter and T is the sampling period.

Figure 2:
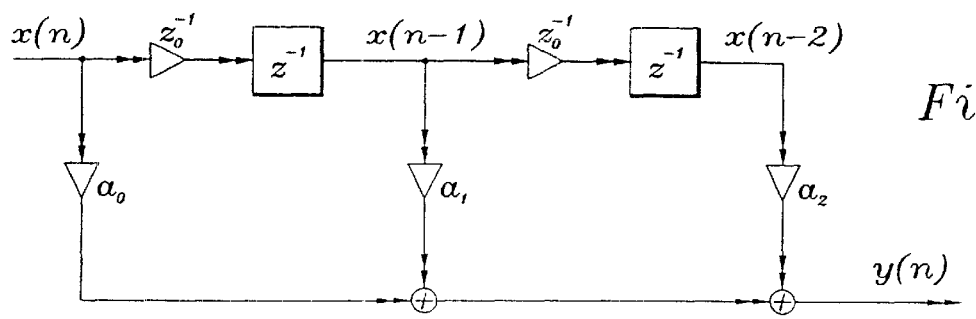
FIG. 2 is a block diagram of an embodiment of a corresponding complex FIR filter.

Assuming that FIG. 1 represents the low-pass filter prototype, the corresponding complex bandpass filter may be of the form shown in FIG. 2. In FIG. 2 a multiplication by a factor $z_0^{-1}$ is associated with each delay element $z^{-1}$. Furthermore, in FIG. 2 the signal paths have been provided with double arrow heads in order to emphasize that the signals may be complex valued.

Figure 3:
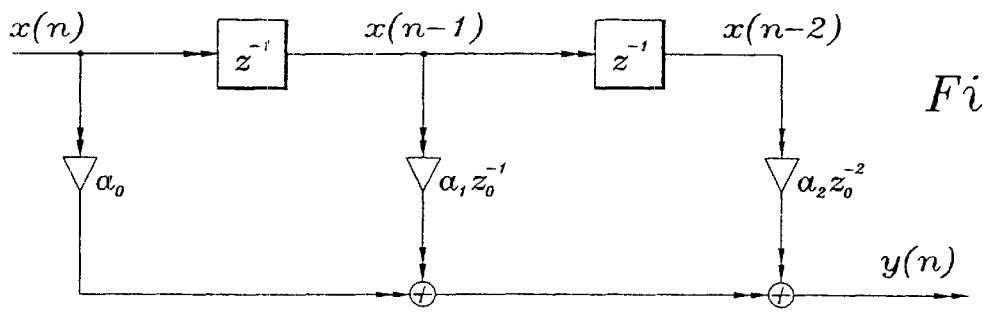
FIG. 3 is a block diagram of another embodiment of a complex FIR filter.

FIG. 3 shows an equivalent complex filter, in which the complex multiplication has been combined with the filter coefficients instead, thereby reducing the number of required multipliers. Thus, the transfer functions of the filters in FIGS. 2 and 3 are the same.

Figure 4:
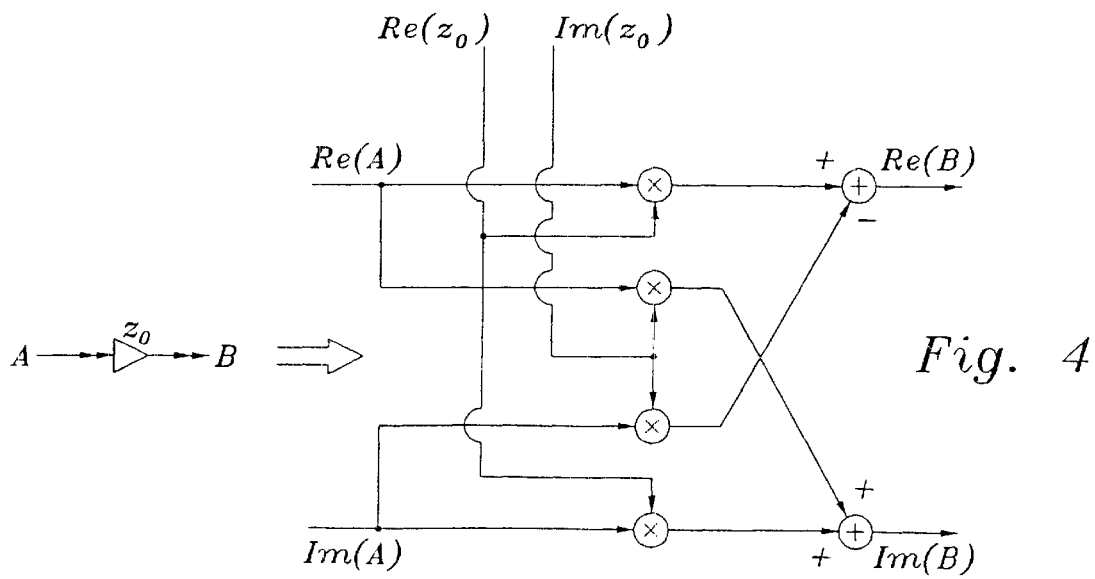
FIG. 4 is a block diagram illustrating complex multiplication performed by the filters in FIGS. 2 and 3.

FIG. 4 illustrates a possible implementation of a multiplication of a complex input signal A by a complex coefficient $z_0$ for obtaining a complex output signal B. As may be seen from FIG. 4 this is accomplished by splitting the signals A and B and the multiplication coefficient $z_0$ into their respective real and imaginary components and performing 4 real multiplications and 2 real additions.

Figure 5:
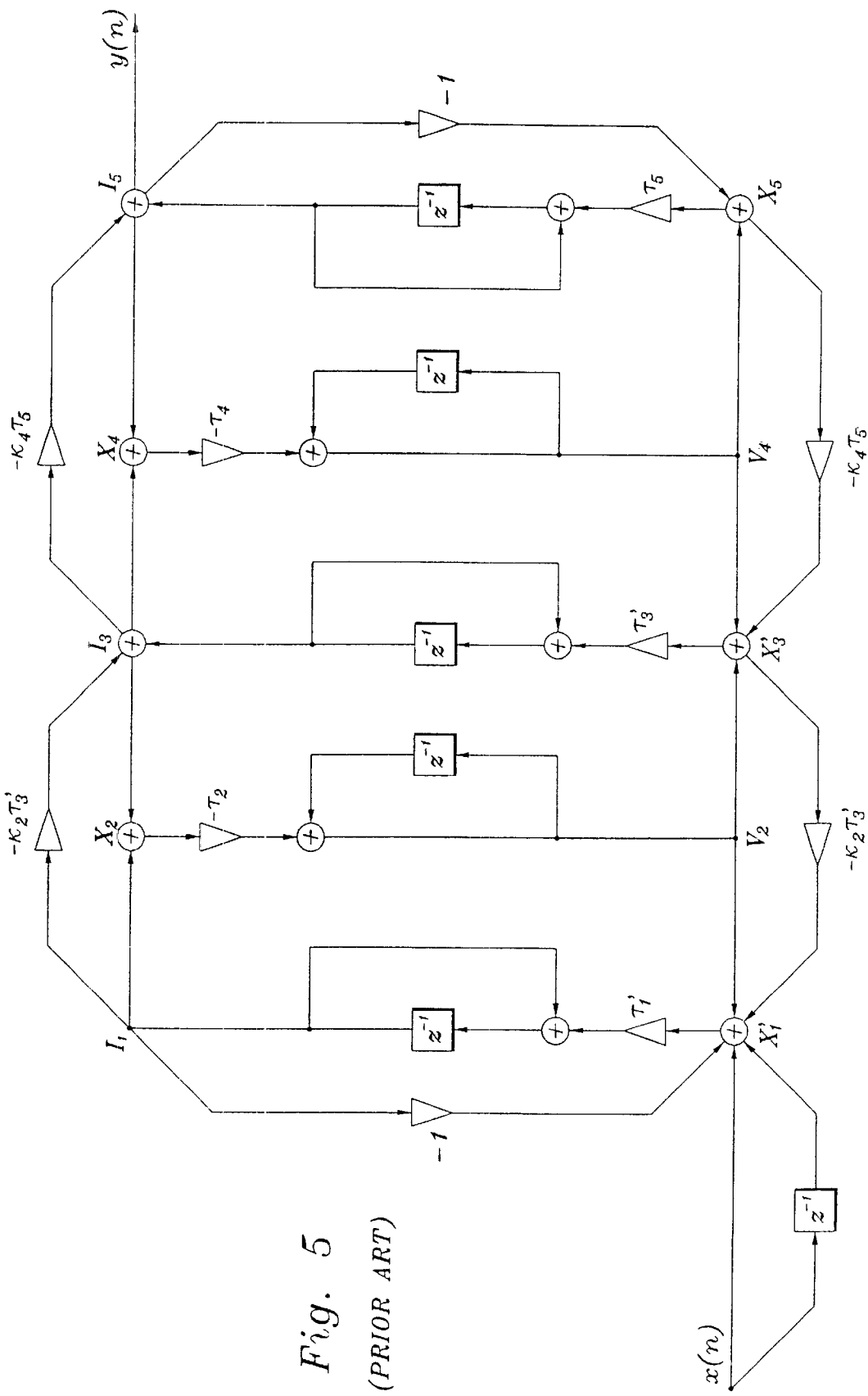
FIG. 5 is a block diagram of a real bilinear digital ladder filter (BDLF filter)
Figure 6:
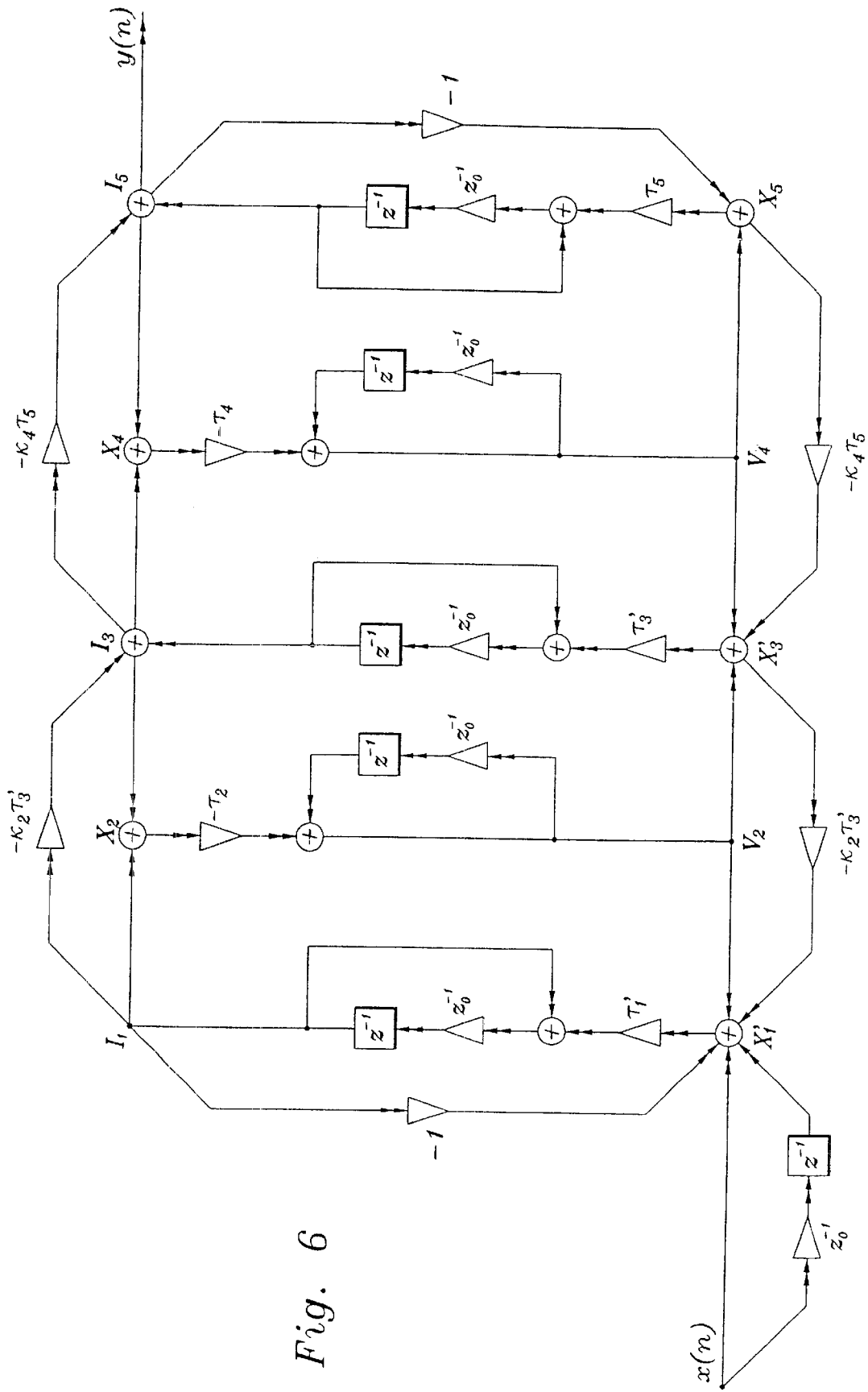
FIG. 6 is a block diagram of an embodiment of a complex BDLF filter in accordance with the present invention.

An especially attractive form of digital filters are so called bilinear digital ladder filters (BDLF filters). The advantages of real BDLF filter are extensively discussed in [1]. This publication demonstrates that these filters outperform previously known real filter structures, such as wave digital filters (WDF filters) and cascade coupled biquads with respect to coefficient quantization and signal quantization noise levels. Furthermore, in comparison to WDF filters they turn out to have a less complicated structure in terms of the total number of required adders. FIG. 5 shows a block diagram of a real fifth order BDLF low-pass filter. In this figure the same designations have been used as in [1]. Of special interest here are the delay elements $z^{-1}$. If these elements are supplemented by a multiplication by $z_0^{-1}$ this low-pass filter may be transformed into a bandpass filter as the filters of FIGS. 2 and 3. Such a complex BDLF bandpass filter is illustrated in the block diagram of FIG. 6. (By utilizing high pass filters or wideband low-pass filter prototypes it is also possible to design complex band stop filters by performing the frequency shift on these prototypes instead.) The reason complex BDLF filters are preferred is that they maintain the excellent properties of real BDLF filters mentioned above.

After having described complex filters as such, the application of these filters to the base station according to the present invention will now be described.

Figure 7:
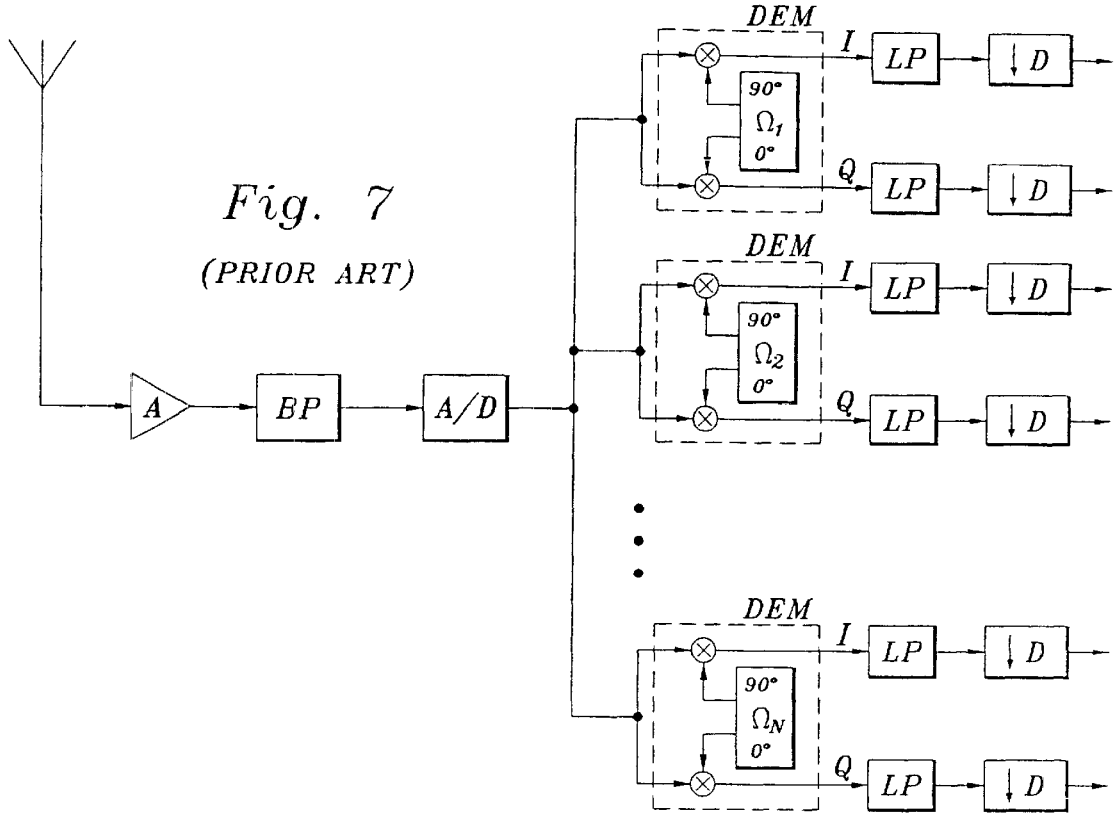
FIG. 7 is a block diagram of a previously known base station that transforms a wideband high-frequency signal into separated baseband signals.

FIG. 7 illustrates a typical base station in a radio communication system. To facilitate the description, only the blocks that are necessary to describe the difference between the prior art and the present invention are included in the figure. An antenna receives a wideband signal that is amplified in a amplifier A, passed through a bandpass filter BP and converted into a digital real wideband signal by an analog-to-digital converter A/D. In the illustrated embodiment the A/D conversion is performed directly on the RF signal, however, it is also possible to perform the A/D conversion on an IF signal by including one or more mixing stages between bandpass filter BP and the A/D converter. The digital wideband signal includes all the channels (in an FDMA system) or channel groups (in a TDMA system). Thus, a channel or channel group separation is performed by feeding the digital wideband signal to a set of demodulators DEM. These demodulators have respective demodulation frequencies $\Omega_1, \Omega_2, \ldots, \Omega_N$, which correspond to the center frequencies of the frequency bands that are to be separated. The demodulator produces the inphase (I) and quadrature (Q) components of each frequency band. However, since the demodulation is performed on the entire wideband signal the I and Q components have to be low-pass filtered in filters LP. The signals are now at baseband, but have an unnecessary high sampling rate. Therefore the sampling rate is reduced in down-samplers ↓D, which essentially discard the required number of samples to reduce the sampling rate. For example, if the wideband signal has a bandwidth of 30 MHz and comprises 1,000 channels (N=1000) or channel groups, each having a band width of only 30 kHz, down-samplers ↓D will typically retain only every 1000th sample.

A serious drawback of this previously known base station is that the demodulation has to be performed at a very high frequency (of the same order of magnitude as twice the bandwidth of the wideband signal). Since the signal is already in digital form, this implies an enormous amount of multiplications of the samples by sine and cosine values stored in tables.

Figure 8:
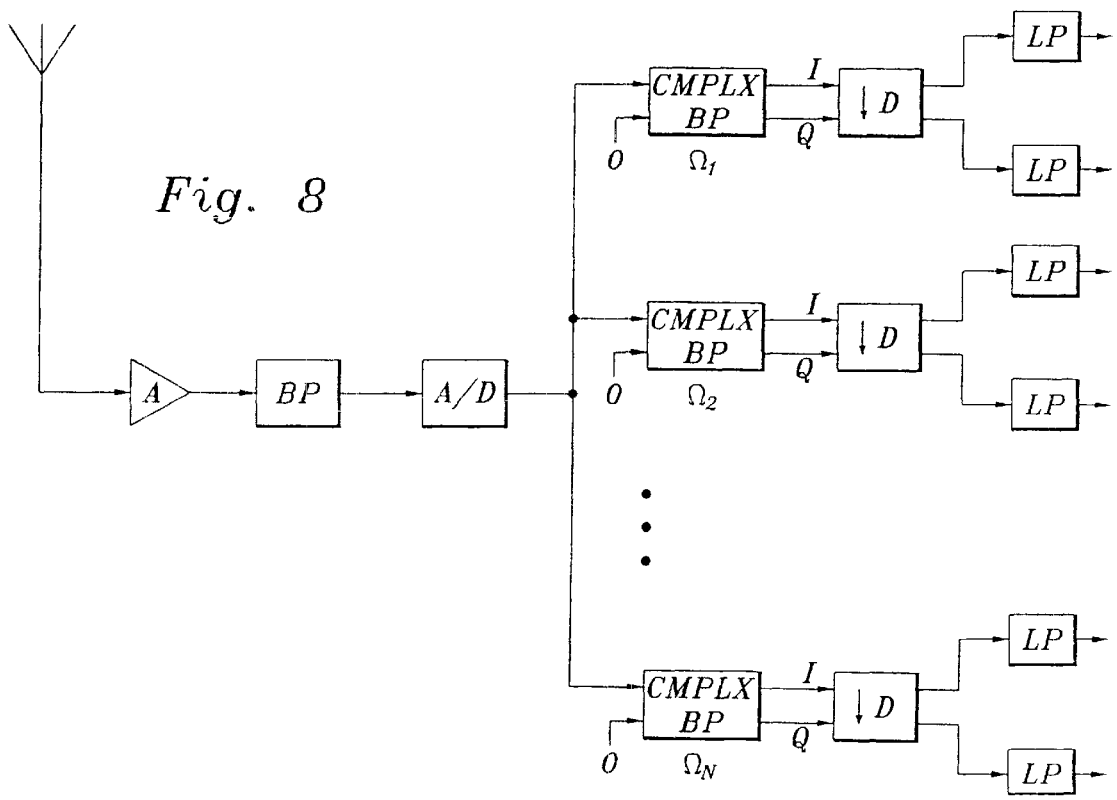
FIG. 8 is a block diagram of a preferred embodiment of a base station in accordance with the present invention that transforms a wideband high-frequency signal into separated baseband signals.

FIG. 8 illustrates a similar block diagram of a base station in accordance with the present invention. The received signal is amplified, bandpass filtered and converted to digital form as in the embodiment of FIG. 7. However, the digital wideband signal is not forwarded to demodulators as in FIG. 7, but is instead forwarded to a set of complex bandpass filters CMPLX BP having center frequencies $\Omega_1, \Omega_2, \ldots, \Omega_N$. Since the wideband signal is a real signal, the other input to these complex bandpass filters CMPLX BP will be 0 (in this description it is assumed that the upper input and output signals of a complex bandpass filter correspond to the real parts while the lower input and output signals correspond to the imaginary part). These complex digital bandpass filters will directly produce the desired I and Q components (since the real and imaginary output signals from a complex filter are already in quadrature), but at the narrow high-frequency bands centered around $\Omega_1, \Omega_2, \ldots, \Omega_N$ instead of at the baseband. These I and Q components are down-sampled in down-samplers ↓D. If the wideband signal is assumed to have a bandwidth of 30 MHz and the narrow bands are assumed to have a bandwidth of 30 kHz, the decimation will be of the order of 1000 times. Finally the decimated signals are low-pass filtered in digital low-pass filters LP.

Figures 9, 10:
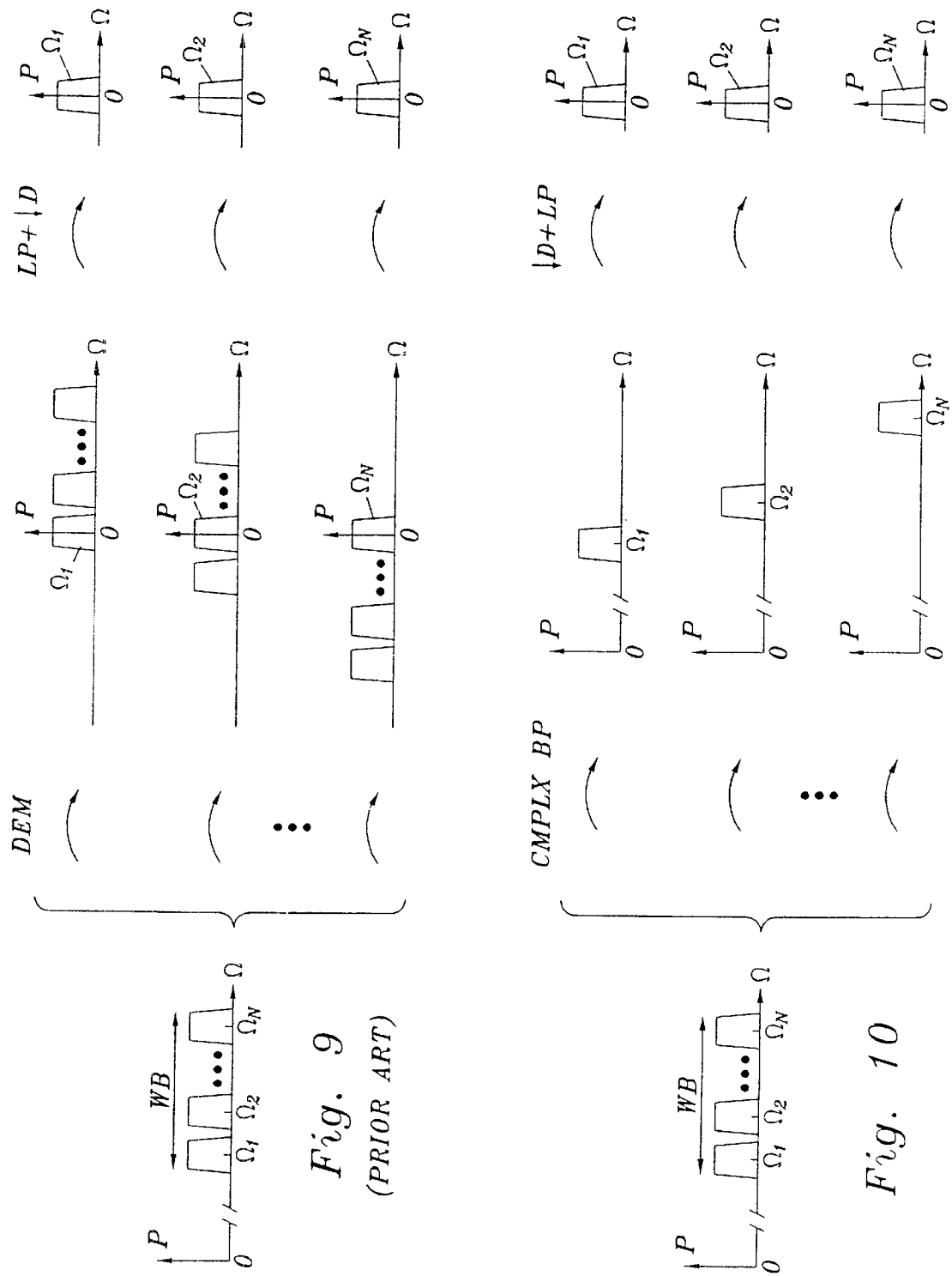
FIG. 9 is a power spectrum diagram illustrating the operation of the base station in FIG. 7.
FIG. 10 is a power spectrum diagram illustrating the operation of the base station in FIG. 8.

FIGS. 9 and 10 compare the signal processing of the previously known base station in FIG. 7 and the base station of the present invention in accordance with the embodiment of FIG. 8. Both embodiments start with a digital wideband signal WB. This wideband signal contains a large number of frequency bands, each band containing a channel or channel group. In FIGS. 9 and 10 P represents the power of the respective signals, while $\Omega$ represents (angular) frequency. Wideband signal WB is a high-frequency signal. This fact has been represented by a broken frequency axis. In the previously known base station the demodulations bring the channels of the wideband signal down to baseband. This may be seen in the middle of FIG. 9. Note that the entire signal has been transformed to the base band, and that different frequency bands of the wideband signal are centered on the base band, depending on the used demodulation frequencies $\Omega_1, \Omega_2, \ldots, \Omega_N$.

In the base station of the present invention instead of demodulating wideband signal WB, this signal is passed through a set complex bandpass filters CMPLX BP. This transforms the wideband signal WB into a set of complex high-frequency narrowband signals centered around center frequencies $\Omega_1, \Omega_2, \ldots, \Omega_N$ as illustrated in the middle of FIG. 10.

In the previously known base station the low-pass filtering will remove the unwanted narrow frequency bands and the decimation will reduce the sampling rate. The result will be the separated baseband signals illustrated on the right in FIG. 9.

In the base station of the present invention the complex narrowband high-frequency signals are decimated. Finally, these decimated signals are low-pass filtered for obtaining the separated complex baseband signals. These steps will be further described with reference to FIGS. 15–31.

FIGS. 7–10 described how a wideband signal is separated into channels or channel groups. FIGS. 11–14 describe the reverse process, namely how channels or channel groups may be combined into a wideband signal for transmission by a base station.

Figure 11:
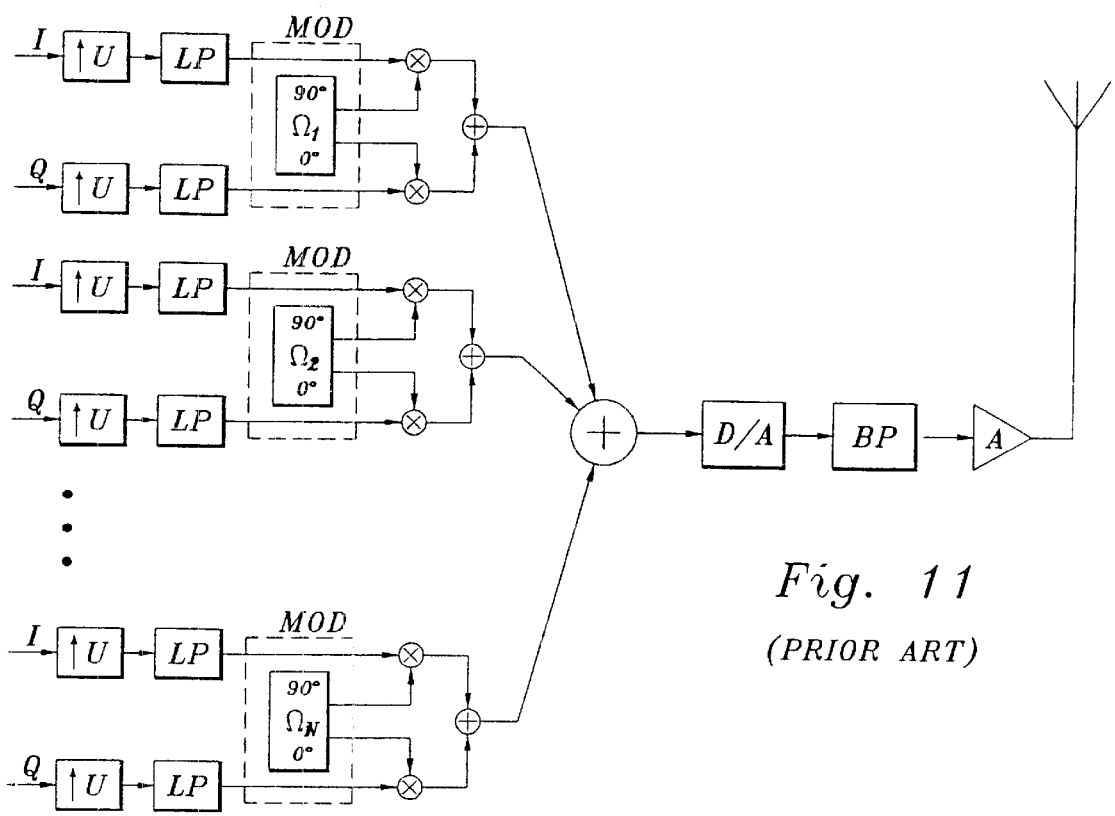
FIG. 11 is a block diagram of a previously known base station that transforms a set of baseband signals into a wideband high-frequency signal.

FIG. 11 shows the prior art solution to this problem. The I and Q components, which now are baseband signals, are interpolated in up-samplers ↑U and lowpass filters LP. This up-sampling may be performed by inserting a number of zero samples between every sample of I and Q. If the same frequency bands as before are assumed, 999 zeros will be inserted between every sample of I and Q. This up-sampling produces a sequence in which replicas of the original spectrum are produced. The interpolated sequence is then obtained by low-pass filtering these signals in low-pass filters LP. This removes the replicas of the spectrum that are obtained by the zero filling. The interpolated signals are then modulated in modulators MOD at modulation frequencies $\Omega_1, \Omega_2, \ldots, \Omega_N$. The resulting components are combined in adders, and the obtained real narrowband high-frequency signals are combined, D/A converted, bandpass filtered (BP), amplified (A) and transmitted. This previously known base station has the same drawback as the base station in FIG. 7, namely that an enormous amount of multiplications have to be performed during the modulation process of the interpolated signal.

Figure 12:
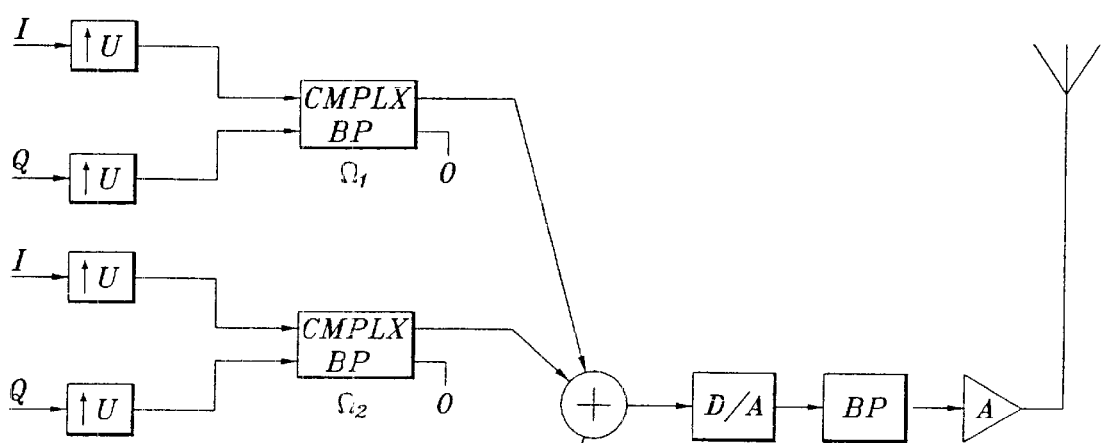
FIG. 12 is a preferred embodiment of a base station in accordance with the present invention that transforms a set of baseband signals into a wideband high-frequency signal.

FIG. 12 illustrates a corresponding base station in accordance with the present invention. As in the embodiment of FIG. 11 zero filling will introduce replicas of the spectra. However, in this case one of these replicas is chosen as the spectrum that is to be maintained, namely the replica with center frequency $\Omega_i$, i=1, 2, ..., N. This narrow spectrum is obtained by filtering the zero filled or up-sampled signals through complex bandpass filters CMPLX BP with center frequencies $\Omega_1, \Omega_2, \ldots, \Omega_N$. As a side effect a real narrowband high-frequency signal is obtained directly from these complex bandpass filters (in reality a small imaginary part may remain due to, for example, quantization errors, but this part is simply ignored). The rest of the base station in FIG. 12 corresponds to the base station in FIG. 11.

Figure 13:
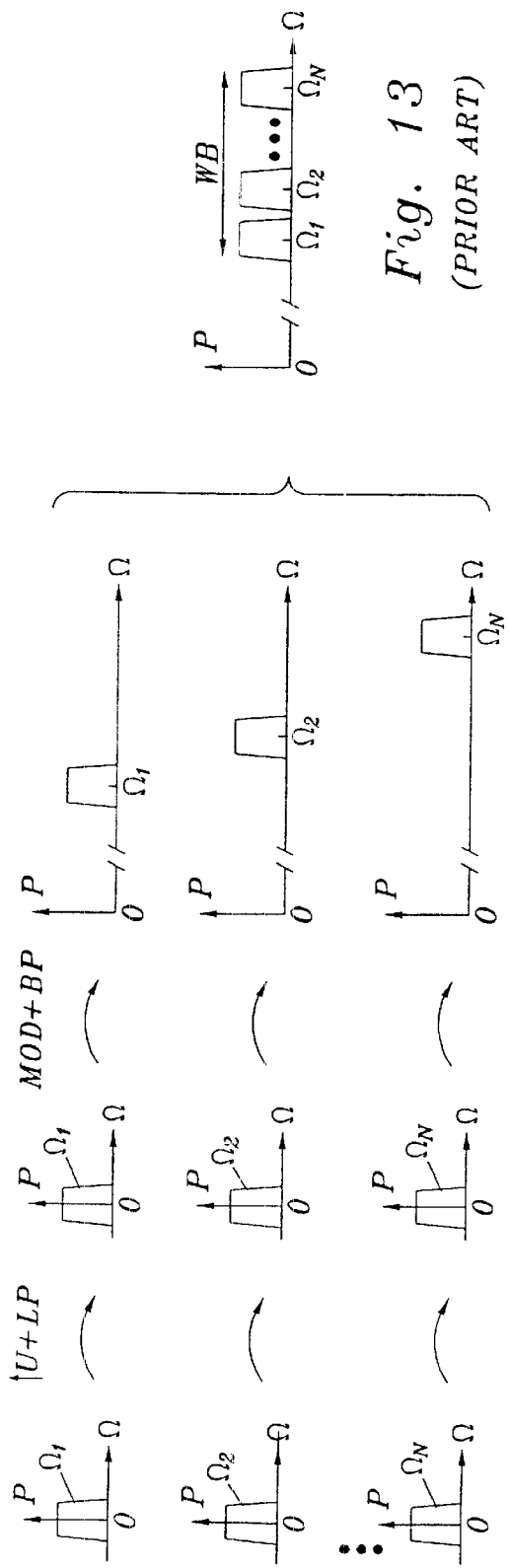
FIG. 13 is a power spectrum diagram illustrating the operation of the base station in FIG. 11.
Figure 14:
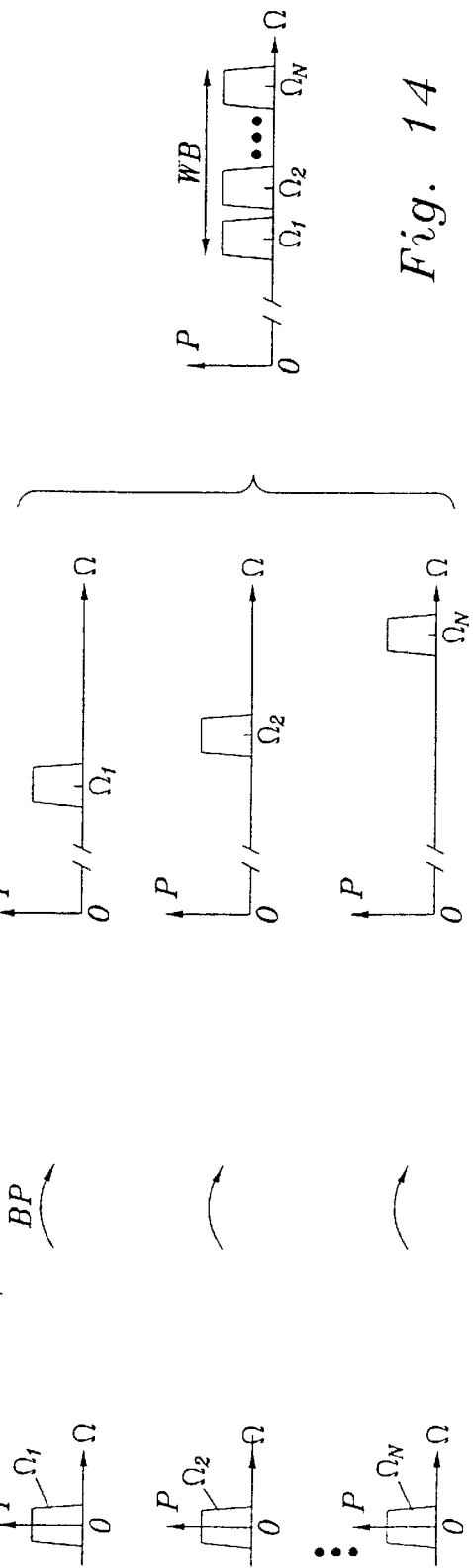
FIG. 14 is a power spectrum diagram illustrating the operation of the base station in FIG. 12.

FIGS. 13 and 14 illustrate these processes in signal spectrum form. In FIG. 13, which corresponds to the base station in FIG. 11, the baseband signals are interpolated, modulated and bandpass filtered. This gives the narrowband high-frequency signals in the middle of the figure. These signals are combined into a wideband signal WB.

In FIG. 14, which corresponds to the base station of FIG. 12, the baseband signals are upsampled and bandpass filtered at the corresponding center frequencies $\Omega_1, \Omega_2, \ldots, \Omega_N$. These steps are described in more detail with reference to FIGS. 32–37. Finally the high-frequency narrowband signals are combined into wideband signal WB.

The decimation process will now be explained with reference to FIGS. 15–31.

Figure 15:
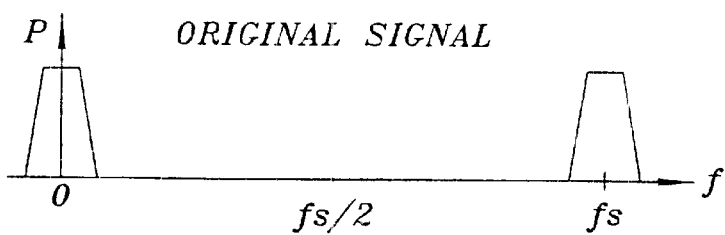
FIG. 15 is a power spectrum diagram illustrating a baseband signal.
Figure 16:
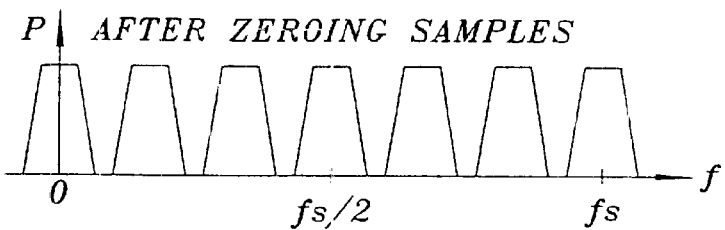
FIG. 16 is a power spectrum diagram illustrating the effect of setting some of the samples in a baseband signal having the power spectrum of FIG. 15 to zero.
Figure 17:
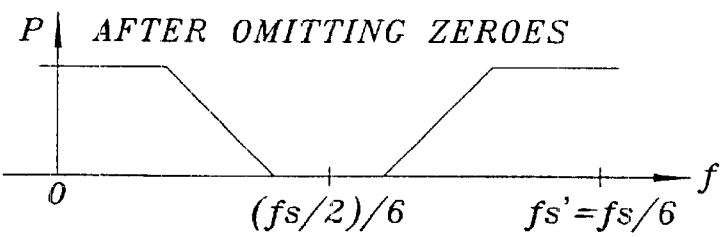
FIG. 17 is a power spectrum diagram illustrating the effect of omitting the zero samples in a signal having the power spectrum of FIG. 16.

FIGS. 15–17 illustrate decimation of a baseband signal. The spectrum of the original signal is shown in FIG. 15. A new signal may be obtained from this signal by retaining every Mth sample and setting the rest of the samples equal to zero. For example, performing this process with M=6 produces a signal with the spectrum shown in FIG. 16. The effect of the "zeroing" is to produce uniformly spaced replicas of the original spectrum. The decimation is completed by omitting the zero samples. The resulting spectrum is shown in FIG. 17. The effect of omitting the zero samples is to lower the sampling frequency from fs to fs' (fs'=fs/6 in the example).

In practice the above described "zeroing" step is omitted and only every Mth sample is retained. However, the "zeroing" step makes it easier to understand how the same decimation process may also be used for passband signals. This will now be explained with reference to FIGS. 18–20.

Figure 18:
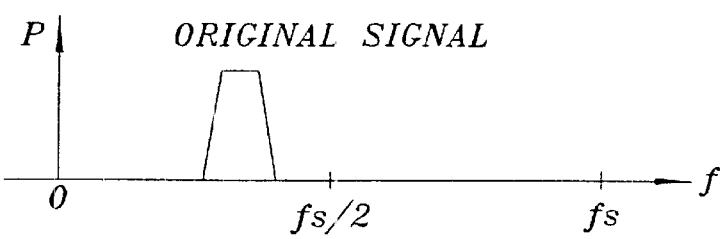
FIG. 18 is a power spectrum diagram illustrating a passband signal.
Figure 19:
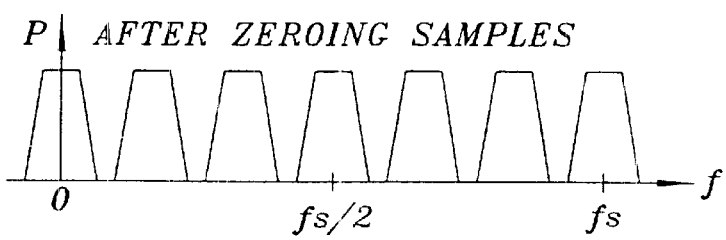
FIG. 19 is a power spectrum diagram illustrating the effect of setting some of the samples in a passband signal having the power spectrum of FIG. 18 to zero.
Figure 20:
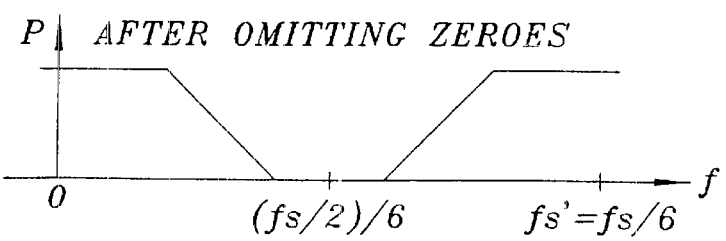
FIG. 20 is a power spectrum diagram illustrating the effect of omitting the zero samples in a signal having the power spectrum of FIG. 19.

FIG. 18 illustrates the spectrum of a passband signal. As in the case with the baseband signal replicas of this spectrum are produced by zero filling the original signal. If the sampling frequency fs and decimation factor M have been carefully selected, the spectrum of one of the replicas of the passband signal will fall into the baseband. This is illustrated by FIG. 19. In fact a comparison between FIGS. 16 and 19 shows that they are in fact identical. Thus, by omitting the zero samples a decimated baseband signal with lower sampling frequency will be obtained also in this case, as illustrated by FIG. 20.

Thus, a key feature in the conversion of a passband signal to baseband by decimation is that the passband signal falls on the "replica grid" produced by the "zeroing". In such a case a replica of the passband signal spectrum will automatically be produced in the baseband. A higher decimation factor will produce a denser grid and therefor increase the number of possible passband positions.

FIGS. 21–25 illustrate decimation by a factor M=10. FIG. 21 illustrates the spectrum of the wideband signal from analog-to-digital converter A/D in FIG. 8. Here all possible "replica grid" positions have been indicated. However, the operator of the radio communication system is allocated only a certain frequency band in this wideband signal. In FIG. 21 only 3 channels (or channel groups) have been reserved for this operator. Note that all 3 channels lie on the "replica grid". It is therefor possible to separate and convert all 3 channels to baseband. Assume that the first of these channels is to be separated and converted to baseband. This has been indicated in FIG. 22 where the thick line represents the transfer function of a complex bandpass filter. After filtering the spectrum in FIG. 23 is obtained. This is similar to the spectrum in FIG. 18. Therefore FIGS. 24 and 25 are similar to FIGS. 19 and 20, respectively. Note that the replicas in FIG. 24 lie in the same grid positions as the channels in FIG. 21 as intended. Since the other 2 channels used by the operator also lie on the same grid, it is possible to convert also these channels to base band by using the same decimation factor (M=10).

Since the channel separation typically is only of the order of 25–30 kHz and the wideband signal may have a bandwidth of the order of 30 MHz, this puts rather tough requirements on the complex bandpass filter, since the transition band is very narrow. FIGS. 26–31 illustrate a way to reduce these requirements by widening the transition band.

FIG. 26 illustrates a similar wideband signal as in FIG. 21. However, in this case not every channel in the operator band is actually used, rather only channel 1 and 3 are used. As will be shown below, this makes it possible to choose a wider filter as illustrated in FIG. 27. After complex bandpass filtering (FIG. 28), zeroing (FIG. 29) and omission of zeroes the spectrum looks as in FIG. 30. (Note that in this example the decimation factor M=5.) The unwanted part of the spectrum may be eliminated by a lowpass filter (LP in FIG. 8) represented by the wide solid line in FIG. 30. The result is the spectrum in FIG. 31. If a decimation factor M=10 is desirable, this may be still be accomplished by performing another decimation by a factor 2(M=5*2=10) on the signal in FIG. 31. This would result in the same spectrum as in FIG. 25.

Figure 32:
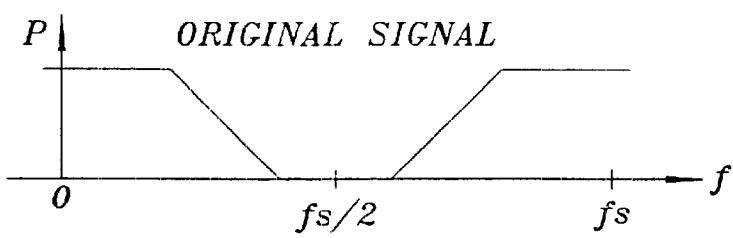
FIG. 32 is a power spectrum diagram illustrating a baseband signal.
Figure 33:
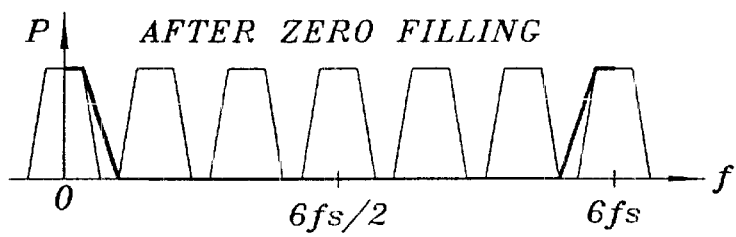
FIG. 33 is a power spectrum diagram illustrating the effect of zero filling a baseband signal having the power spectrum of FIG. 32.
Figure 34:
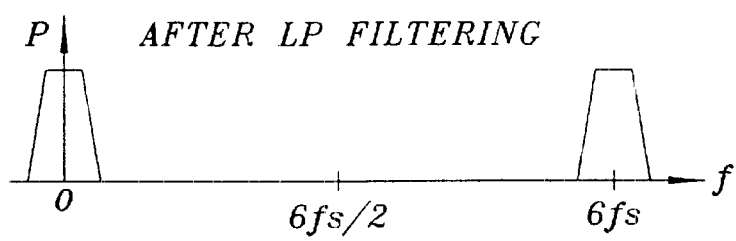
FIG. 34 is a power spectrum diagram illustrating the effect of lowpass filtering a signal having the power spectrum of FIG. 33.

FIGS. 32–37 illustrate the interpolation or up-sampling process in more detail. FIG. 32 shows the spectrum of a baseband signal. The spectrum in FIG. 33 represents the spectrum of a signal obtained by zero filling the signal having the spectrum in FIG. 32. In the example 6 zeroes have been inserted between every sample in the original signal. After lowpass filtering (indicated by the wide solid line in FIG. 33) the spectrum of the interpolated signal looks as in FIG. 34.

Figure 35:
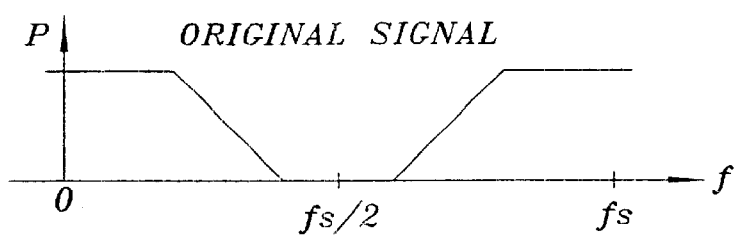
FIG. 35 is a power spectrum diagram illustrating a baseband signal.
Figure 36:
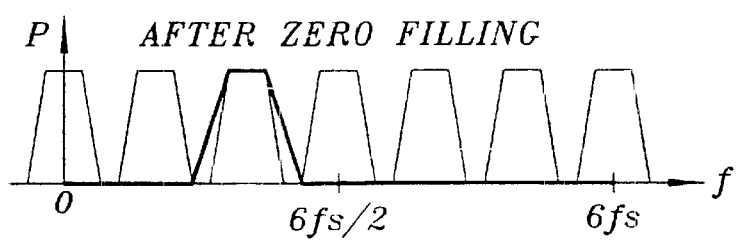
FIG. 36 is a power spectrum diagram illustrating the effect of zero filling a baseband signal having the power spectrum of FIG. 35.
Figure 37:
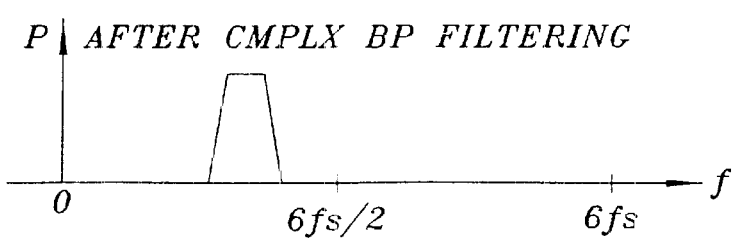
FIG. 37 is a power spectrum diagram illustrating the effect of complex passband filtering a signal having the power spectrum of FIG. 36.

As in the case with decimation the above interpolation method may be applied for obtaining passband signals. This is illustrated by FIGS. 35–37. FIG. 35 shows the same original signal as FIG. 32. After zero filling the spectrum looks as in FIG. 36, which is similar to FIG. 33. However, instead of lowpass filtering to obtain an interpolated baseband signal, one of the replicas is used for further processing. This has been indicated by the wide solid line in FIG. 36. This line represents a complex bandpass filter instead of a lowpass filter (in fact it represents the same lowpass filter transformed to a higher frequency as explained above with reference to FIGS. 1 and 2), which produces the desired high frequency signal (FIG. 36) As in the case of decimation the desired frequency band has to lie on the "replica grid".

Figure 38:
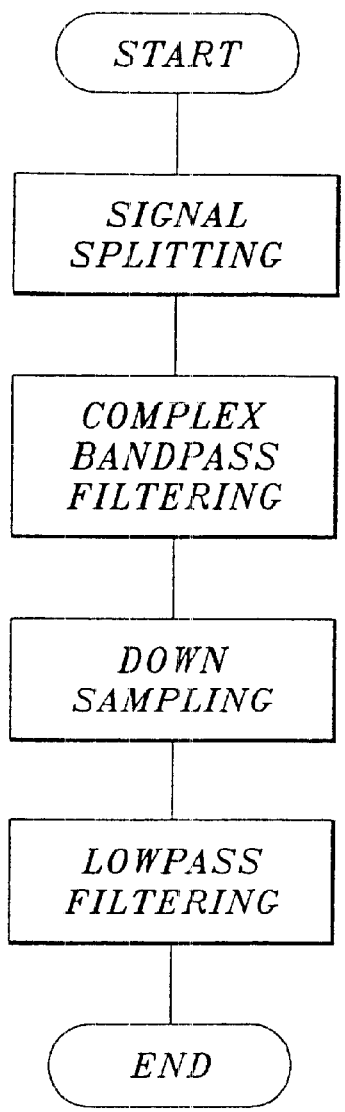
FIG. 38 is a flow chart illustrating the method for transforming a wideband signal into a set of baseband signals in accordance with the present invention.

FIG. 38 is a flow chart illustrating the essential steps in the channel or channel group separation method in accordance with the present invention.

Figure 39:
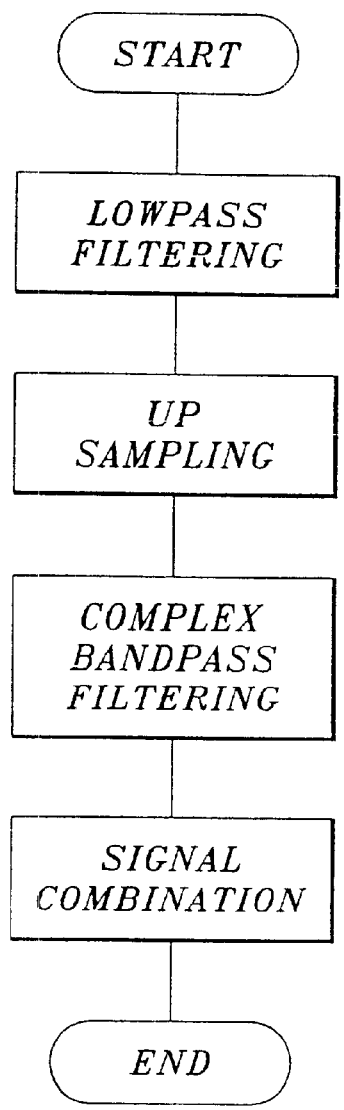
FIG. 39 is a flow chart illustrating the method for transforming a set of baseband signals into a wideband signal in accordance with the present invention.

FIG. 39 is a flow chart illustrating the essential steps in the channel or channel group combination method in accordance with the present invention.

Figure 40:
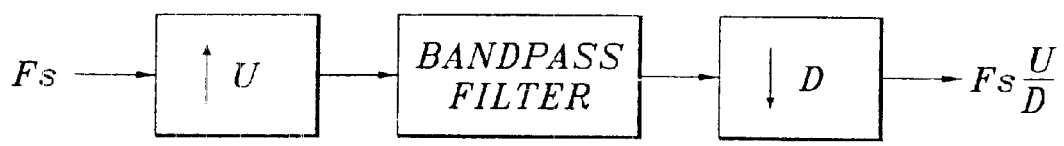
FIG. 40 is a block diagram of a more general sampling rate converter that converts sampling frequencies by rational ratios.

FIG. 40 illustrates a generalization of the decimation and interpolation methods described above. In FIG. 18 the resampling of the signal is performed by a rational factor U/D. This is done by an up-sampling by a factor U, followed by bandpass filtering and down-sampling by a factor D. In this way it may be easier to adapt the channels to the "replica grid".

As noted above the preferred embodiment of the present invention relies on the feature that channels lie on, or may be transformed to (by rational resampling), the proper "replica grid". However, some of the channels may not lie on or be resampled to such a grid, which means that these channels may not be directly decimated down to baseband or interpolated up to passband. In such a case most of the advantage obtained by the present invention may still be gained by performing a demodulation after decimation or a modulation before interpolation for these channels. These extra steps move these channels to frequencies on the grid, but do so at a low demodulation/modulation frequency instead of a high frequency as in the prior art. This still significantly reduces complexity.

Figure 41:
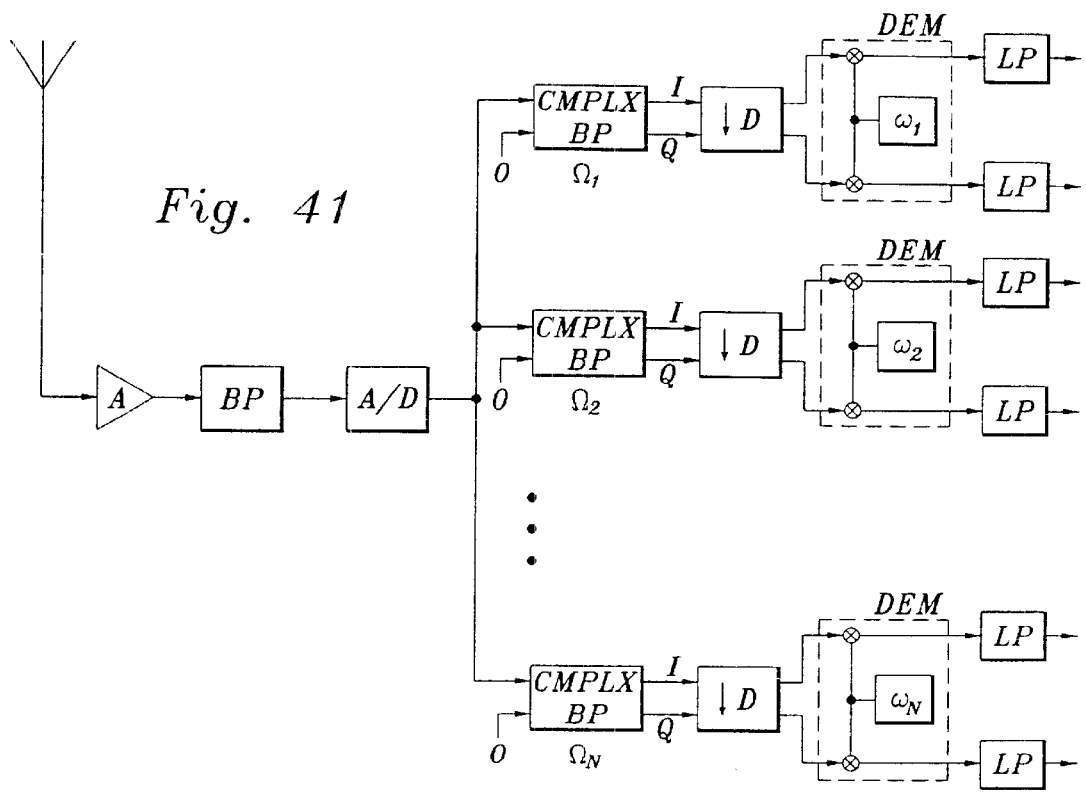
FIG. 41 is a block diagram of a modified embodiment of a base station in accordance with the present invention that transforms a wideband high-frequency signal into separated baseband signals.

FIG. 41 is a block diagram of a modified embodiment of a base station in accordance with the present invention that transforms a wideband high-frequency signal into separated baseband signals. The difference between this modified version and the preferred embodiment of FIG. 8 is that low frequency demodulators DEM, defined by demodulation frequencies $\omega_1, \omega_2, \ldots, \omega_N$, have been provided after decimators ↓D to down-convert the channels that did not quite reach baseband by the decimation. Since this may apply only to some of the channels, the demodolators DEM are surrounded by a dashed line (they are only included if actually needed).

Figure 42:
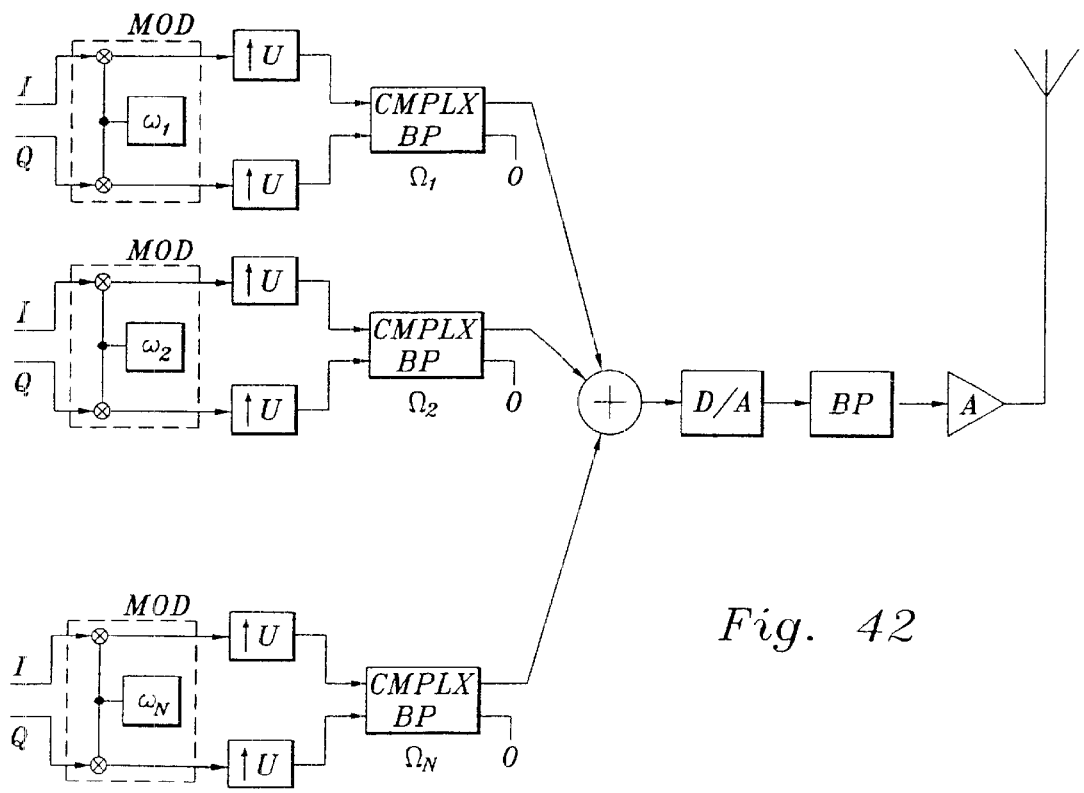
FIG. 42 is a modified embodiment of a base station in accordance with the present invention that transforms a set of baseband signals into a wideband high-frequency signal.

FIG. 42 is a modified embodiment of a base station in accordance with the present invention that transforms a set of baseband signals into a wideband high-frequency signal. The difference between this modified version and the preferred embodiment of FIG. 12 is that low frequency modulators MOD, defined by modulation frequencies $\omega_1, \omega_2, \ldots, \omega_N$, have been provided before interpolators ↑U to up-convert the channels that would not quite reach the passband by the interpolation. Since this may apply only to some of the channels, the modulators MOD are surrounded by a dashed line (they are only included if actually needed).

Figure 43:
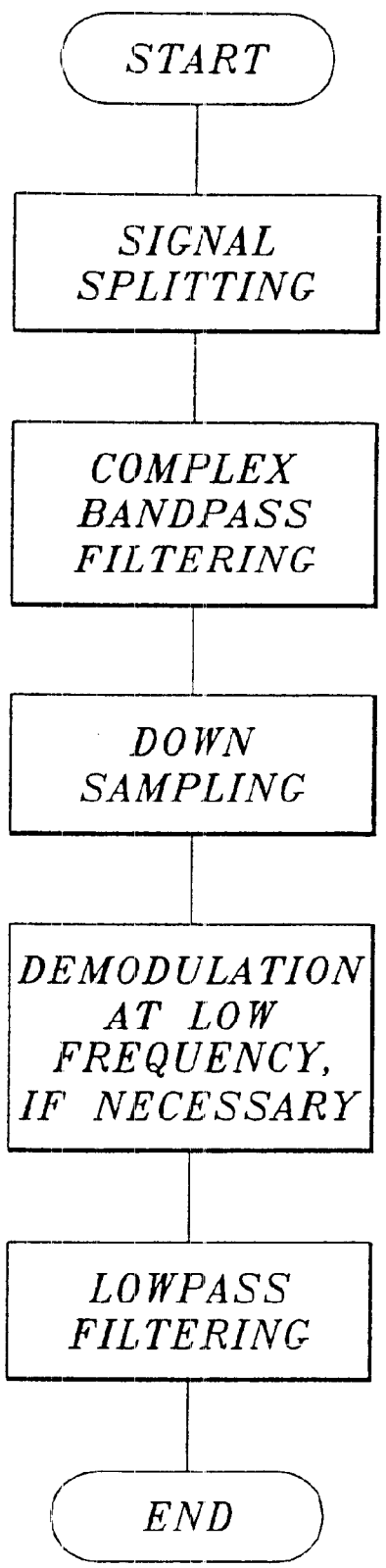
FIG. 43 is a flow chart illustrating a modified method in accordance with the present invention for transforming a wideband signal into a set of baseband signals.

FIG. 43 is a flow chart illustrating the modified method for transforming a wideband signal into a set of baseband signals in accordance with the present invention. The difference with respect to the flow chart in FIG. 38 is the extra demodulation step after the down-sampling step.

Figure 44:
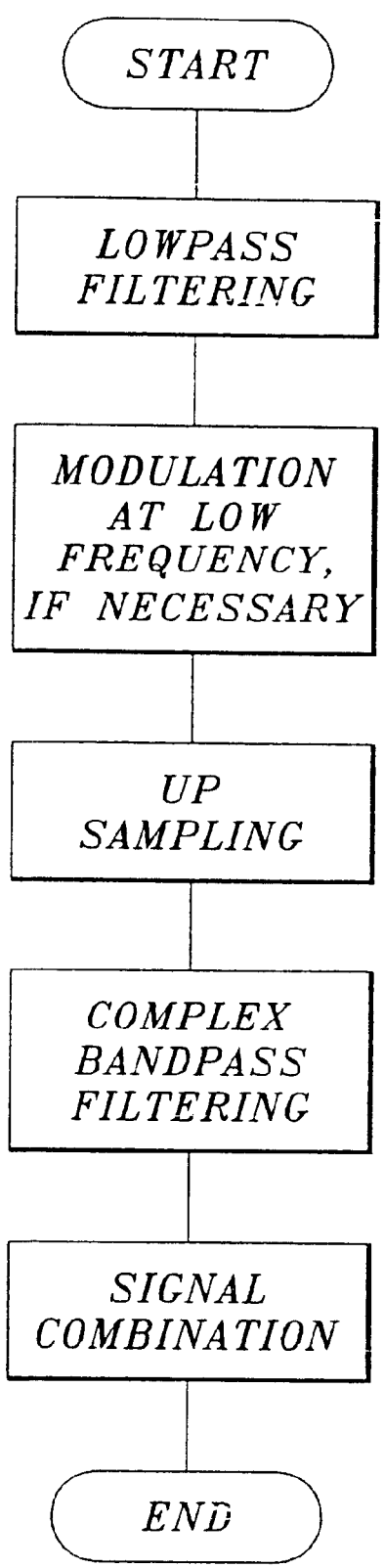
FIG. 44 is a flow chart illustrating modified method-in accordance with the present invention for transforming a set of baseband signals into a wideband signal.

FIG. 44 is a flow chart illustrating the modified method for transforming a set of baseband signals into a wideband signal in accordance with the present invention. The difference with respect to the flow chart in FIG. 39 is the extra modulation step before the up-sampling step.

As has been mentioned above the complex bandpass filters that are used in the base station of the present invention preferably comprise complex BDLF filters, but it should be understood that other complex filter structures, such as FIR filters, WDF filters, biquads, etc may also be used.

It will be understood by those skilled in the art that various modifications and changes may be made to the present invention without departure from the spirit and scope thereof, which is defined by the appended claims.

CITATION

[1] S. Signell, T. Kouyoumdjiev, K. Mossberg, L. Harnefors, "Design and Analysis of Bilinear Digital Ladder Filters", IEEE Transactions of Circuits and Systems, February, 1996

What is claimed is:

1. A signal transformation method, comprising the steps of:
   modulating at least a set of complex digital baseband signals;
   up-sampling the set of complex digital baseband signals, each having an I component and a Q component, to form a set of complex digital high-frequency signals, each having a corresponding I component and a Q component;
   forming a set of real digital narrowband high-frequency signals by filtering said set of complex high-frequency signals through a corresponding set of complex digital bandpass filters having substantially non-overlapping narrow passbands;
   combining said real narrowband high-frequency signals to form a real digital wideband high-frequency signal; and
   D/A converting the real digital wideband high-frequency bandpass signal into a real analog wideband high-frequency bandpass signal.

2. An apparatus for transforming a set of complex digital baseband signals into a real digital wideband high-frequency signal, comprising:
   means for converting said set of complex digital baseband signals, each having an I component and a Q component, into a set of complex digital high-frequency signals, each having a corresponding I component and a corresponding Q component, by up-sampling each complex digital baseband signal into a corresponding complex digital high-frequency signal;
   a set of complex digital bandpass filters having substantially non-overlapping narrow passbands for filtering said set of complex digital high-frequency signals, with respective I and Q components, into a set of real digital narrowband high-frequency signals, the complex digital bandpass filters being formed by a real digital lowpass filter that has been transformed into a complex digital bandpass filter through a transformation of its digital lowpass filter transfer function into a complex digital bandpass filter transfer function; and
   means for adding said real digital narrowband high-frequency signals for forming said real digital wideband high-frequency signal.

3. The apparatus of claim 2, wherein said converting means includes modulators for modulating at least some of said complex digital baseband signals before up-sampling.

4. The apparatus of claim 2, wherein said complex digital bandpass filters are formed by bilinear digital ladder filters with complex transfer functions.

5. The apparatus of claim 2, wherein the apparatus is used in a base station operating in a radio communication system for transforming a set of complex digital baseband signals into a real digital wideband high-frequency signal.

6. A signal transformation apparatus, including:
   a modulator for modulating at least a set of complex digital baseband signals;
   an up-sampler for converting the set of said complex digital baseband signals, each having an I component and a Q component, into a set of complex digital high-frequency signals, each having a corresponding I component and a Q component;
   a set of complex digital bandpass filters having substantially non-overlapping narrow passbands for filtering said set of complex high-frequency signals into a set of real digital narrowband high-frequency signals;

a signal combiner for adding said real digital narrowband high-frequency signals to form a real digital wideband high-frequency signal; and a D/A converter for converting the real digital wideband high-frequency bandpass signal into a real analog wideband high-frequency bandpass signal.

7. The apparatus of claim 6, wherein each of said complex digital bandpass filters is formed by a real digital lowpass filter that has been transformed into a complex digital bandpass filter through a transformation of its digital lowpass filter transfer function into a complex digital bandpass filter transfer function.

8. The apparatus of claim 7, wherein said complex digital bandpass filters are formed by bilinear digital ladder filters with complex transfer functions.

9. The apparatus of claim 6, wherein the apparatus is used in a base station operating in a radio communication system for transforming a set of complex digital baseband signals into a real analog wideband high-frequency signal.

* * * * *